United States Patent
Ko et al.

(10) Patent No.: US 8,034,641 B2
(45) Date of Patent: Oct. 11, 2011

(54) METHOD FOR INSPECTION OF DEFECTS ON A SUBSTRATE

(75) Inventors: Woo-seok Ko, Seoul (KR); Chung-sam Jun, Suwon-si (KR); Hyung-su Son, Hwaseong-si (KR); Yu-sin Yang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/911,190

(22) Filed: Oct. 25, 2010

(65) Prior Publication Data

US 2011/0097829 A1    Apr. 28, 2011

(30) Foreign Application Priority Data

Oct. 26, 2009    (KR) .................. 10-2009-0101730

(51) Int. Cl.
*H01L 21/66* (2006.01)
(52) U.S. Cl. .............. 438/16; 438/14; 438/15; 438/17; 438/18; 438/52; 257/E21.53; 257/315; 257/48; 73/105
(58) Field of Classification Search ............. 438/16, 438/14, 15, 17, 18, 52; 257/E21.53, 315, 257/48; 73/105; 850/1
See application file for complete search history.

(56) References Cited

U.S. PATENT DOCUMENTS

| 7,107,826 B2* | 9/2006 | Watanabe et al. ............... 73/105 |
| 2006/0254348 A1* | 11/2006 | Watanabe et al. ............... 73/105 |
| 2008/0105043 A1* | 5/2008 | Yasutake et al. ............... 73/105 |

FOREIGN PATENT DOCUMENTS

| JP | 2003-227788 A | 8/2003 |
| JP | 2004-340893 A | 12/2004 |
| KR | 10-2008-0057079 A | 6/2008 |

* cited by examiner

*Primary Examiner* — Matthew Smith
*Assistant Examiner* — Wilner Jean Baptiste
(74) *Attorney, Agent, or Firm* — Lee & Morse, P.C.

(57) ABSTRACT

A method for inspection of defects on a substrate includes positioning a probe of a scanning probe microscopy (SPM) over and spaced apart from a substrate, includes scanning the substrate by changing a relative position of the probe with respect to the substrate on a plane spaced apart from and parallel to the substrate, and includes measuring a value of an induced current generated via the probe in at least two different regions of the substrate. The value of the induced current is variable according to at least a shape and a material of the substrate. The method further includes determining whether a defect exists by comparing the values of the induced currents measured in the at least two different regions of the substrate.

20 Claims, 15 Drawing Sheets

NORMAL REGION    DEFECT REGION

NORMAL REGION I    DEFECT REGION    NORMAL REGION II

METHOD FOR INSPECTION OF DEFECTS ON A SUBSTRATE

BACKGROUND

1. Field

Embodiments relates to a substrate defect inspection method and a method of manufacturing a semiconductor device using the method, and more particularly, to a minute defect inspection method.

2. Description of the Related Art

Recently, due to developments in the semiconductor industry and increasing user needs, electronic devices are becoming smaller and lighter, thus semiconductor devices that are important elements of electronic devices are required to be more integrated. In regard to manufacturing integrated semiconductor devices, pattern miniaturization is essential.

Thus, detection and management of minute defects, which were not a serious problem before, are becoming essential. However, as electronic devices are becoming smaller, defects that should be detected and managed are becoming more difficult to be found, and thus difficulties may arise in detecting and managing minute defects.

SUMMARY

Embodiments are therefore directed to a method for inspection of defects on a substrate and a method of manufacturing a semiconductor device using the method, which substantially overcome one or more of the problems due to the limitations and disadvantages of the related art.

At least one of the above and other features and advantages may be realized by providing a method for inspection of defects on a substrate including positioning a probe of a scanning probe microscopy (SPM) over and spaced apart from a substrate; scanning the substrate by changing a relative position of the probe with respect to the substrate; measuring the value of an induced current generated via the probe wherein the value varies with respect to position of the probe according to shape and material of the substrate; and determining whether a defect exists, by comparing the induced current values measured in at least two different regions of the substrate.

The scanning of the substrate may include; vibrating the probe with a constant amplitude along a first straight line on the plane spaced apart from and parallel to the substrate; and moving the probe in a zigzag manner with respect to the substrate by moving the center of the vibration at a constant speed along a second straight line on the plane spaced apart from and parallel to the substrate the second straight line being perpendicular to the first straight line.

Before the positioning of the probe, the method may include designating a defect inspection region on the substrate; and dividing the defect inspection region into a plurality of comparison inspection regions wherein the pattern formed in each of the comparison inspection regions is the same for one another. The determining the existence of the defect may include comparing the induced current values measured in each of two different comparison inspection regions.

The determining the existence of the defect may include comparing the induced current values measured in each of three different comparison inspection regions.

The dividing of the defect inspection region into a plurality of comparison inspection regions may include dividing the defect inspection region into dies formed in the substrate.

The defect inspection region on the substrate may include a cell region of the substrate or a repeated pattern formation region adjacent to the cell region.

A distance between the substrate and the probe may be in the range of from about 10 nm to about 400 nm.

The scanning of the substrate may further include moving the center of the vibration at a constant speed along a third straight line spaced apart from the second straight line and parallel to the second straight line, wherein the second straight line and the third straight line are spaced apart from each other at a distance the same as or less than distance of the amplitude of the vibration.

The determining the existence of the defect may include comparing the induced current values measured in the at least two different regions, and then when the comparison result of the induced current value is greater than a predetermined threshold value, determining that a defect exists.

The comparing of the induced current values measured may include: selecting any one of the three comparison inspecting regions as a standard inspecting region; and comparing the induced current value measured in the standard inspecting region with each of the induced current values measured in the two other comparison inspecting regions and obtaining two comparison results; wherein when the two comparison results are greater than a predetermined threshold value, the standard inspection region is determined to include a defect.

The probes may be a plurality of probes that are spaced apart from the substrate at the same distance.

At least one of the above and other features and advantages may also be realized by providing a method for inspection defects on a substrate defect inspection method, the method including: positioning a probe of an SPM on a substrate so as to be spaced apart from the substrate; scanning the substrate by changing a relative position of the probe with respect to the substrate while rotating the substrate; measuring the value of an induced current value generated via probe wherein the value varies with respect to position of the probe according to shape and material of the substrate; and determining whether a defect exists by comparing the induced current values measured in the at least two different regions of the substrate.

The scanning of the substrate may include moving the probe from an outer portion to a center of the substrate or from the center to the outer portion of the substrate while rotating the substrate.

The scanning of the substrate may include controlling a rotation speed of the substrate, so that the probe has a constant linear velocity (CLV) with respect to on the basis of a pathway of the probe on the substrate.

The scanning of the substrate may include rotating the substrate at a constant angular velocity.

After the measuring of the induced current value, the method further may include compensating the measured induced current value according to a speed of the probe with respect to a pathway of the probe on the substrate.

According to another aspect of the inventive concept, there is provided a method of manufacturing a semiconductor device, the method including: preparing a semiconductor substrate; and forming a semiconductor device on the semiconductor substrate, wherein the forming the semiconductor device may includes: forming a thin film on the semiconductor substrate; scanning the semiconductor substrate with a probe of an SPM, the probe being spaced apart from an uppermost surface of the semiconductor by a fixed interval; measuring the value of an induced current generated via the probe, wherein the value varies with respect to the position of the probe according to the shape and material of the substrate;

and determining whether a defect exists or not by comparing the measured values of the induced current in at least two different regions of the semiconductor substrate.

After the forming of the thin film, the method further may comprise forming a pattern by partially removing the thin film.

The forming of the pattern may comprise forming a contact hole by removing the thin film partially.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
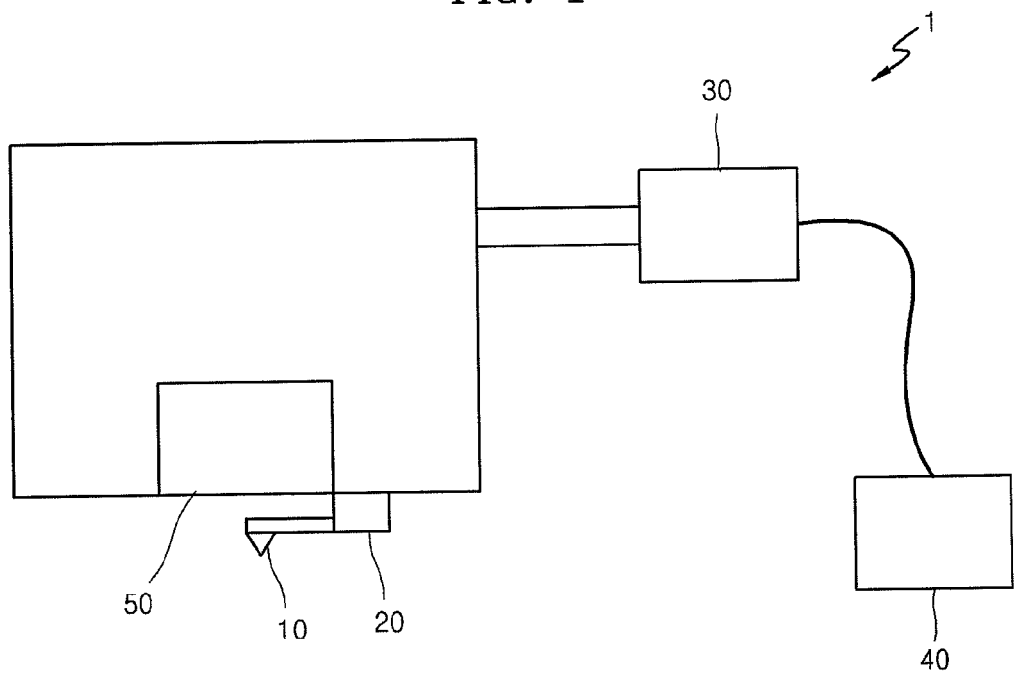
FIG. 1 illustrates a schematic view of a defect inspection apparatus according to an exemplary embodiment.

Korean Patent Application No. 10-2009-0101730, filed on Oct. 26, 2009, in the Korean Intellectual Property Office, and entitled: "Method for Inspection of Defects on a Substrate," is incorporated by reference herein in its entirety.

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional description of the inventive concept are provided in descriptive sense only; various changes in form and details may be made therein and thus should not be construed as being limited to the embodiments set forth herein. As the inventive concept is not limited to the embodiments described in the present description, and thus it should not be understood that the inventive concept includes every kind of variation examples or alternative equivalents included in the spirit and scope of the inventive concept.

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

It will be understood that when an element is referred to as being "connected to", or "contacting" another element throughout the specification, it can be directly "connected to" or "contacting" the other element, or intervening elements may also be present. On the other hand, when a component is referred to as being "directly connected to" or "directly contacting" another element, it will be understood that no intervening element is present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic view of a defect inspection apparatus according to an embodiment of the present invention.

Referring to FIG. 1, a defect inspection apparatus 1 includes a probe 10 of a scanning probe microscopy (SPM) and a vibration generating unit 20. For example, the type of SPM may be atomic force microscopy (AFM), but the present invention is not limited thereto. The type of SPM may be scanning tunneling microscopy (STM), scanning capacitance microscopy (SCM), or any other microscopy using scanning that may generate an induced current.

The probe 10 has a tip with a sharp end portion disposed on a cantilever that may be formed of silicon, silicon oxide, or silicon nitride. The vibration generating unit 20 may include a piezoelectric scanner, and the vibration generating unit 20 can minutely vibrate the probe 10 at a high speed. The vibration generating unit 20 may vibrate the probe 10 in a direction with a constant amplitude and at a frequency of about several tens of kHz to about several thousands of kHz.

The defect inspection apparatus 1 may further include a driving unit 30 that may mechanically shift or move the probe 10 and the vibration generating unit 20. The driving unit 30 may shift or move the probe 10 and the vibration generating unit 20 regardless of the vibration of the probe 10. For example, the driving unit 30 may shift or move the probe 10 and the vibration generating unit 20 in a parallel direction, a perpendicular direction, or a direction inbetween with respect to an amplitude direction of the vibration of the probe 10. A plane formed between the amplitude direction of the vibration of the probe 10 and a shifting direction or moving direction of the probe 10 and the vibration generating unit 20 may be parallel to a substrate 500 to be measured.

When the probe 10 moves adjacent to the substrate 500 to be measured, an induced current may be generated according to the shape and material of the substrate 500. Details of the induced current will be described later. Accordingly, the defect inspection apparatus 1 may further include a controlling and analyzing unit 40 that may detect and analyze the induced current generated by the probe 10. The controlling and analyzing unit 40 can control the vibration generating unit 20 and the driving unit 30 and analyze the position, vibration, or moving speed of the probe 10 and the induced current together.

The defect inspection apparatus 1 may further optionally include an optical unit 50 that may be used for positioning the probe 10 or aligning the substrate 500 to be measured.

Figure 2:
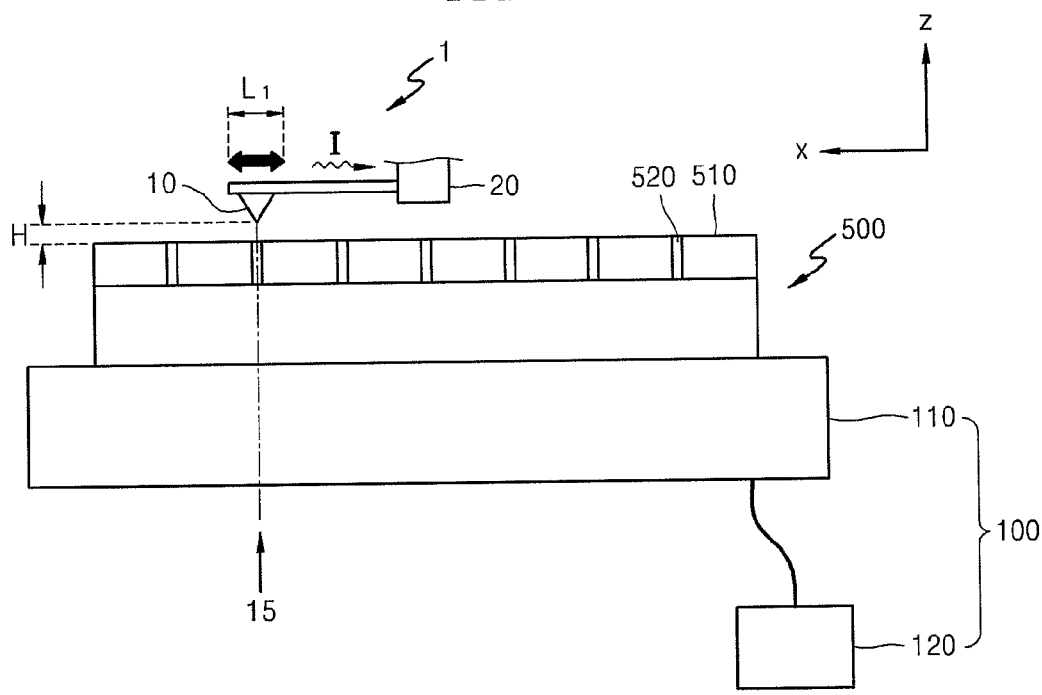
FIG. 2 illustrates a cross-sectional view illustrating a substrate defect inspection method, according to an exemplary embodiment.

FIG. 2 is a cross-sectional view illustrating a substrate defect inspection method, according to an embodiment of the present invention.

Referring to FIG. 2, the defect inspection apparatus 1 may be spaced apart from the substrate 500 in a z-axis direction. An end portion of the probe 10 and an upper surface of the substrate 500 may be spaced apart from each other at a first interval H. The probe 10 may be vibrated by the vibration generating unit 20 with a constant amplitude corresponding to half of a first width $L_1$ along a line parallel to the substrate 500, that is, along a first line extending in a first direction (x-axis direction or –x-axis direction). The probe 10 is parallel to a main surface of the substrate 500.

For the convenience of description, in FIG. 2, the defect inspection apparatus 1 includes only the probe 10 and the vibration generating unit 20, but may include other components such as the driving unit 30 or the controlling and analyzing unit 40, both of which are described in FIG. 1. The components described in FIG. 1 may be referred to below when necessary.

The substrate 500 may be disposed on a stage 110 and fixed thereon via a vacuum. The stage 110 may be connected to a power supplying unit 120 to apply a bias to the substrate 500. The power supplying unit 120 may apply a direct current (DC) voltage and an alternating current (AC) voltage that has an amplitude that is less than the DC voltage. A substrate seating unit 100 including the stage 110 and the power supplying unit 120 may be separated from or combined with the defect inspection apparatus 1 as one device.

A plurality of first regions 510 and a plurality of second regions 520 may be formed on the substrate 500. For example, the first regions 510 and the second regions 520 may be formed of materials different from each other. The second regions 520 may be disposed regularly, as illustrated in FIG. 2, or disposed irregularly on the substrate 500. The first regions 510 and the second regions 520 may have heights and thicknesses different from each other. In other words, each of the first regions 510 may be a pattern or a layer formed of an insulating material, a conductive material, a semiconductor material, or an organic material, and each of the second regions 520 may be a defect, a hole normally formed, or a space between patterns.

When the probe 10 vibrates, an induced current I may be generated according to changes of shapes and/or materials of the substrate 500 below the probe 10. That is, when the probe 10 moves over the first regions 510 and the second regions 520, if the first regions 510 and the second regions 520 are formed of materials different from each other or have different surface heights, the induced current I may be generated accordingly.

The induced current I may be obtained by the following Formula (1):

$$I = \frac{dQ}{dt} = \frac{d(CV)}{dt} = V\frac{dC}{dt} + C\frac{dV}{dt} = Vv\frac{dC}{dx} + Cv\frac{dV}{dx}, \quad \text{Formula 1}$$

In Formula 1, C denotes capacitance between the probe 10 and the substrate 500, and v denotes speed by the vibration of the probe 10. That is, v may be obtained based on vibration frequency of the probe 10 and the first amplitude $L_1$. While the movement of the probe 10 other than its vibration shall be described later, when the speed by vibration is much greater than other movement, the other movement may be disregarded V denotes a voltage applied to the substrate 500, that is, denotes the DC and AC voltages applied to the substrate 500 by the power supplying unit 120.

Figure 3:
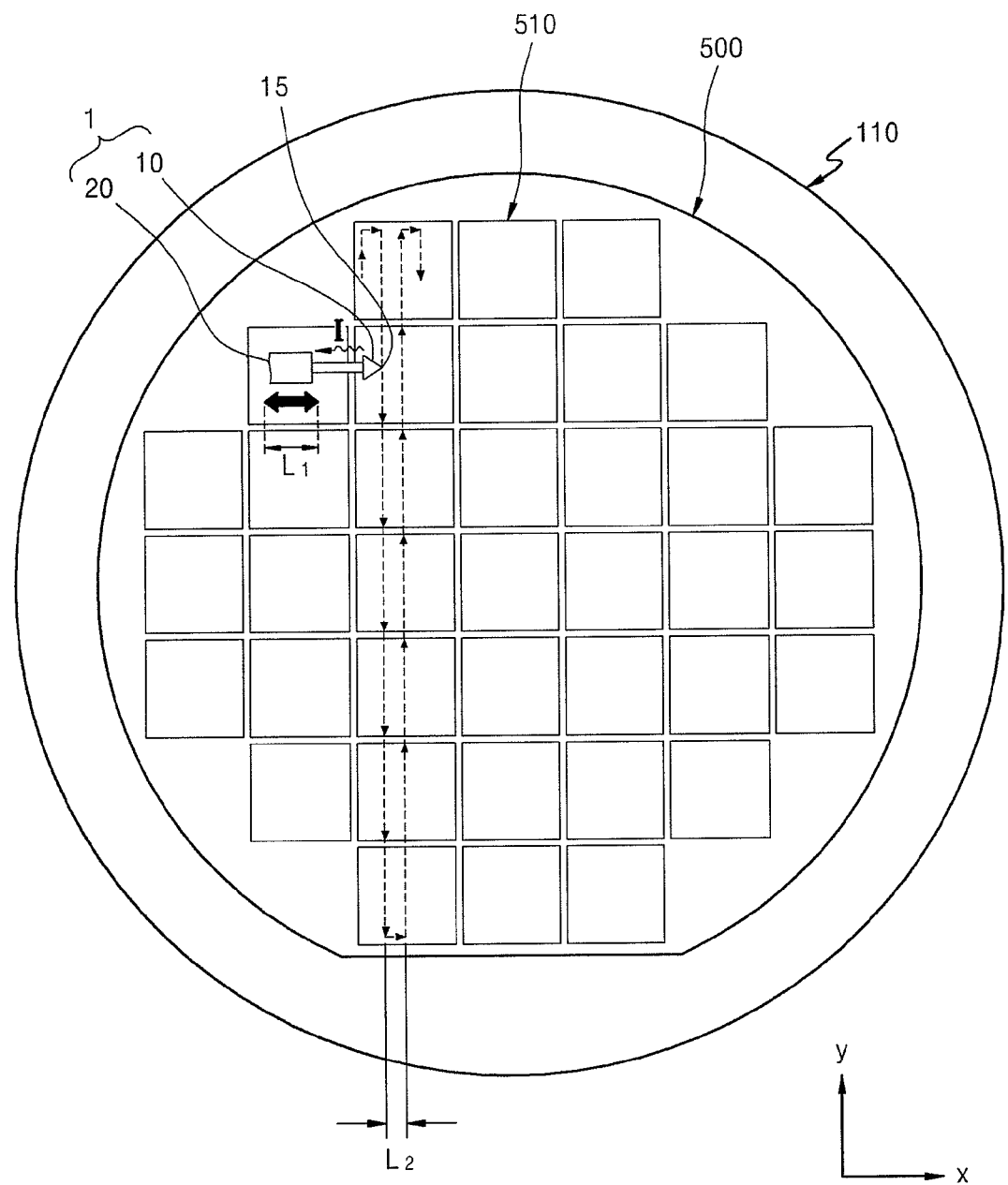
FIG. 3 illustrates a plan view illustrating a method for inspection of defects on a substrate according to an exemplary embodiment.

FIG. 3 is a plan view illustrating a method for inspection of defects on a substrate according to an embodiment of the present invention.

Referring to FIG. 3, the probe 10 of the defect inspection apparatus 1 may vibrate with a constant amplitude corresponding to half of the first width $L_1$ over the substrate 500 disposed on the stage 110. The direction of the vibration may be parallel to the surface of substrate 500. The center of the vibration may be moved along a second line extending in a direction forming an angle with the amplitude direction of the probe 10. For example, the center of the vibration 15 may be moved in a second direction (y-axis direction or –y-axis direction) that is parallel to the substrate 500 and also perpendicular to the amplitude direction of the probe 10. The movement of the center of the vibration 15 in the second direction (y-axis direction or –y-axis direction) may be called a vertical movement, which is a movement vertical to the amplitude direction of the probe 10 and not vertical to the substrate 500. The probe 10 may be moved within an amount corresponding to a diameter of the substrate 500 and be moved beyond the amount before and after defect inspection. The probe 10 is parallel to the main surface of the substrate 500. The vertical movement of the probe 10 may be a constant-speed movement.

The first width $L_1$ may be in the range of about several nm to about several hundreds of nm, which may be a relatively small value compared to the vertical movement in the second direction (y-axis direction or −y-axis direction) of the probe 10. Therefore the vibration of the probe 10 with a constant amplitude corresponding to half of the first width $L_1$ may be referred to as a minute vibration. Also, since the minute vibration of the probe 10 is performed in a frequency range from about several tens of kHz to about several thousands of kHz, the vibration movement of the probe 10 may be much faster than the vertical movement in the second direction (y-axis direction or −y-axis direction). In this case, the minute vibration of the probe 10 may be referred to as a high-speed vibration, and the vertical movement of the center of the vibration 15 may be referred to as a low-speed movement. Since the probe 10 vibrates minutely with a constant amplitude corresponding to half of the first width $L_1$ and the center of the vibration 15 moves vertically at the same time, the probe 10 may move along a zigzag transfer pathway.

After the center of the vibration 15 is moved vertically and the probe 10 performs a line scanning with respect to a defect inspection region of the substrate 500 in the second direction (y-axis direction or −y-axis direction), the center of the minute vibration of the probe 10 may be shifted by a second width $L_2$ in the first direction (x-axis direction or −x-axis direction), which is perpendicular to the second direction (y-axis direction or −y-axis direction) and which may be called a minute shift. After that the probe 10 is shifted minutely, the center of the vibration 15 is moved vertically again in a direction opposite to the second direction (y-axis direction or −y-axis direction). That is, if the center of the vibration 15 is originally moved in the y-axis or −y-axis directions, the center of the vibration 15 may be moved vertically again in the −y-axis or y-axis directions, respectively. That is, after the probe 10 is shifted minutely, the probe 10 may be moved vertically along a third line parallel to the second line, the second line being the original vertical transfer pathway, and spaced apart from the second line by the second width $L_2$. The second width $L_2$ may be the same as or less than the first width $L_1$. An operation wherein the minute shift of the center of the vibration 15 by the second width $L_2$ and setting of the vertical movement of the center of the vibration 15 in a direction opposite to the previous direction are combined may be called a turn operation. That is, the turn operation shifts the probe 10 from one vertical pathway onto another vertical pathway that is set apart the second width $L_2$ in the first direction (x-axis direction or −x-axis direction), and at the same time, reverses the direction of the vertical movement.

The aforementioned vertical movement and minute shift of the probe 10 may be performed by the driving unit 30 of the defect inspection apparatus 1. Instead, a driving apparatus capable of shifting or moving the stage 110 in the first and/or the second directions may be installed in the substrate seating unit 100 to obtain the same effect by instead moving the substrate 500.

Accordingly, scanning with respect to the entire defect inspection region of the substrate 500 may be performed by repeating the above process. That is, the probe 10 may scan the substrate 500 while spaced apart from the substrate 500 on a plane parallel to the main surface of the substrate 500. Accordingly, the first width $L_1$ may correspond to a resolution of one pixel when the defect inspection apparatus 1 scans the substrate 500. However, when the second width $L_2$ is less than the first width $L_1$, the second width $L_2$ may correspond to a resolution of one pixel when the defect inspection apparatus 1 scans the substrate 500.

When the vibration frequency of the minute vibration of the probe 10 is increased, according to the above equation, a greater induced current may be obtained. Accordingly, even if the vertical moving speed of the center of the vibration 15 increases, a sufficiently effective induced current value may be obtained. Therefore, when the vibration frequency of the minute vibration of the probe 10 increases, the substrate 500 may be scanned at a much higher speed. For example, when the vibration frequency of the minute vibration of the probe 10 is 50 kHz and the substrate 500 is a semiconductor substrate with a diameter of 300 mm, scanning of the entire surface of the substrate 500 may take several days depending on the value of the first width $L_1$ or the second width $L_2$. However, when the vibration frequency of the minute vibration of the probe 10 is 1600 kHz, scanning of the entire surface of the substrate 500 may take only a few hours, and thus may be effectively used in a defect inspection during a semiconductor manufacturing process.

When the substrate 500 is a semiconductor substrate, major defect inspection regions of the substrate 500 to be inspected by the defect inspection apparatus 1 may be dies 510 formed in the substrate 500.

Figure 4:
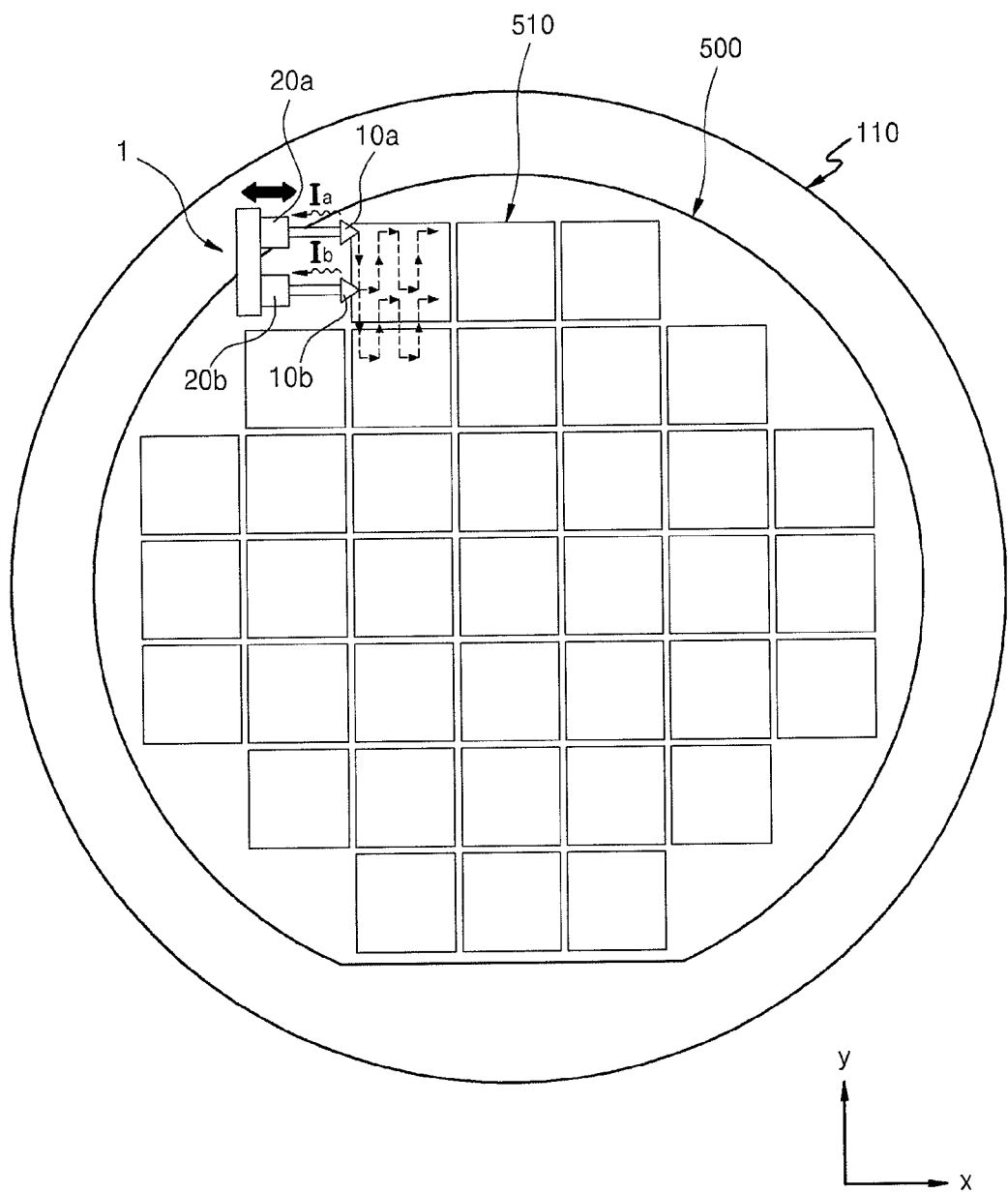
FIG. 4 illustrates a plan view illustrating provides a method for inspection of defects on a substrate according to an exemplary embodiment.

FIG. 4 is a plan view illustrating provides a method for inspection of defects on a substrate according to another embodiment of the present invention.

Referring to FIG. 4, a defect inspection apparatus 1 may include a plurality of probes 10a and 10b and a plurality of vibration generating units 20a and 20b respectively connected to the probes 10a and 10b. In designing the defect inspection apparatus 1 according to the present embodiment, the probes 10a and 10b may be spaced apart from each other in a direction of vertical movement, that is, a second direction (y-axis direction or −y-axis direction), or in a first direction (x-axis direction or −x-axis direction), that is, an amplitude direction of the probes 10a and 10b. In this case, after the probes 10a and 10b are moved vertically by an amount corresponding to an interval between the probes 10a and 10b or by an amount greater than the interval, the probes 10a and 10b may be shifted minutely by the second width $L_2$ as described in FIG. 3. Thus, a plurality of induced currents $I_a$ and $I_b$ may be generated from the probes 10a and 10b.

The defect inspection apparatus 1 may include more probes than just the probes 10a and 10b when necessary. For example, when a semiconductor substrate with a diameter of 300 mm is used as a substrate 500, several to several tens or more of the probes 10a and 10b may be disposed within the width of about 300 mm at a constant interval. In this case, since the multiplicity of probes can scan the substrate 500 simultaneously, the substrate 500 may be inspected at a high speed accordingly.

An optical device or an electron beam device, widely used as a defect inspection apparatus, cannot simultaneously scan and inspect a plurality of regions, without exponentially increasing its cost. However, according to the present embodiment of the present invention, a plurality of regions can be scanned and inspected simultaneously by increasing the number of probes 10a and 10b, which does not require high cost.

Figure 5:
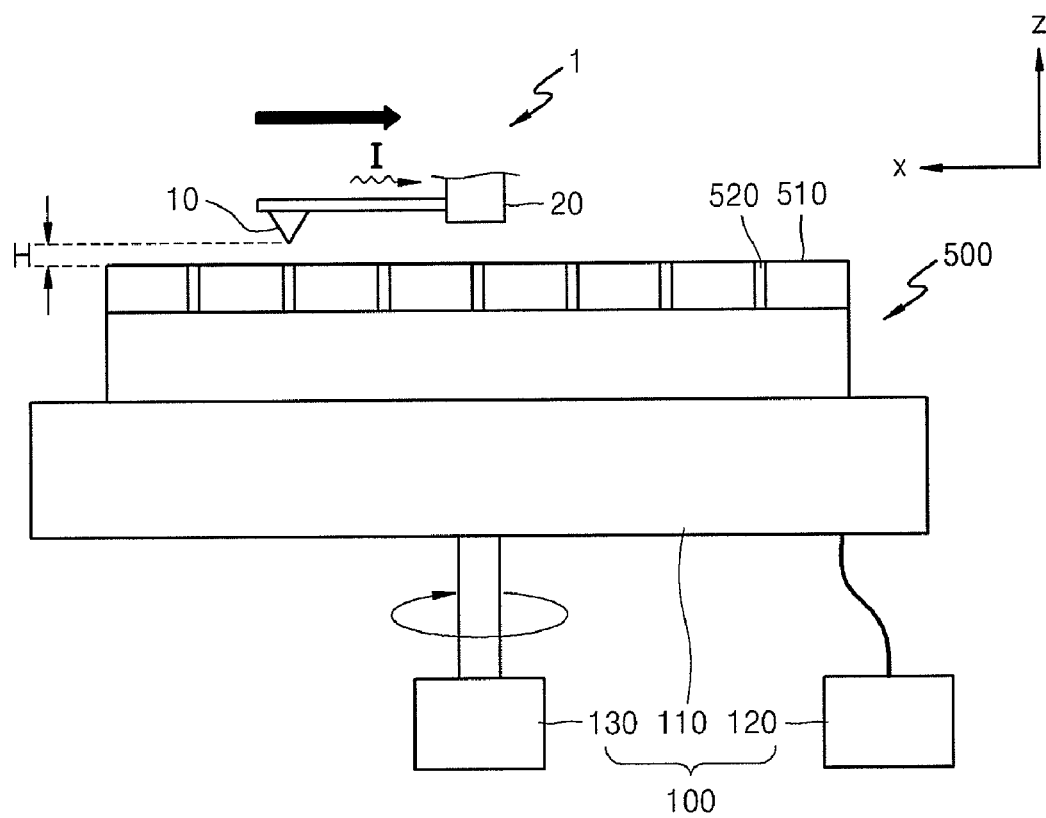
FIG. 5 illustrates a cross-sectional view illustrating a substrate defect inspection method, according to an exemplary embodiment.

FIG. 5 is a cross-sectional view illustrating a substrate defect inspection method, according to another embodiment of the present invention.

Referring to FIG. 5, the defect inspection apparatus 1 may be spaced apart from the upper surface of the substrate 500 in a z-axis direction. An end portion of the probe 10 and an upper surface of the substrate 500 may be spaced apart from each other at a first interval H. For convenience of description, in FIG. 5, the defect inspection apparatus 1 includes only the probe 10 and the vibration generating unit 20, but may include other components such as the driving unit 30 or the controlling and analyzing unit 40, both of which are described in FIG. 1. The components described in FIG. 1 may be referred below when necessary.

The substrate 500 may be disposed on the stage 110 and fixed thereon via a vacuum. For example, the substrate 500 may be a wafer-shaped semiconductor substrate. The stage 110 may be connected to the power supplying unit 120, which may apply a bias to the substrate 500. The power supplying unit 120 may apply a DC voltage and an AC voltage that has an amplitude that is less than the DC voltage. The substrate seating unit 100 including the stage 110 and the power supplying unit 120 may be separated from or combined with the defect inspection apparatus 1 as one device.

The plurality of first regions 510 and the plurality of second regions 520 are formed on the substrate 500. For example, the first regions 510 and the second regions 520 may be formed of materials different from each other. The second regions 520 may be disposed regularly, as illustrated in FIG. 2, or disposed irregularly. The first regions 510 and the second regions 520 may have heights and thicknesses different from each other. In other words, each of the first regions 510 may be a pattern or a layer formed of an insulating material, a conductive material, a semiconductor material, or an organic material, and each of the second regions 520 may be a defect, a hole normally formed, or a space between patterns.

Unlike the method for inspection of defects on a substrate described in FIGS. 2 through 4, in the substrate defect inspection method according to the current embodiment of the present invention, the probe 10 may not minutely vibrate. Instead, the stage 110 may further include a rotating unit 130 for rotating the substrate 500 together with the stage 110. Accordingly, while the substrate 500 rotates, an induced current I may be generated through the probe 10 disposed over the substrate 500. A rotation speed of the substrate 500 may be in the range of several to several tens of thousands of R.P.M.

With the rotation of the substrate 500, the probe 10 may be moved from an outer portion of the substrate 500 to the center of the substrate 500, or vice-versa. At this time, the probe 10 may be moved at a constant speed or in proportion to a rotation speed of the substrate 500, or may be step-shifted by sequentially shifting between predetermined intervals. As such, the driving unit 30 of FIG. 1 may move or shift the probe 10 toward the center portion or the outer portion of the substrate 500. Accordingly, in the method for inspection of defects on a substrate disclosed in the previous embodiment, the probe 10 scans the substrate 500 in a similar way as a scanning method used in a CRT or an SEM, while in the method for inspection of defects on a substrate disclosed in the present embodiment, the probe 10 may scan the substrate 500 in a similar way as a reading method of a CD-ROM drive or a hard-disk drive.

The substrate seating unit 100 including the stage 110, the power supplying unit 120, and the rotating unit 130 may be separated from or combined with the defect inspection apparatus 1 as one device.

Figure 6:
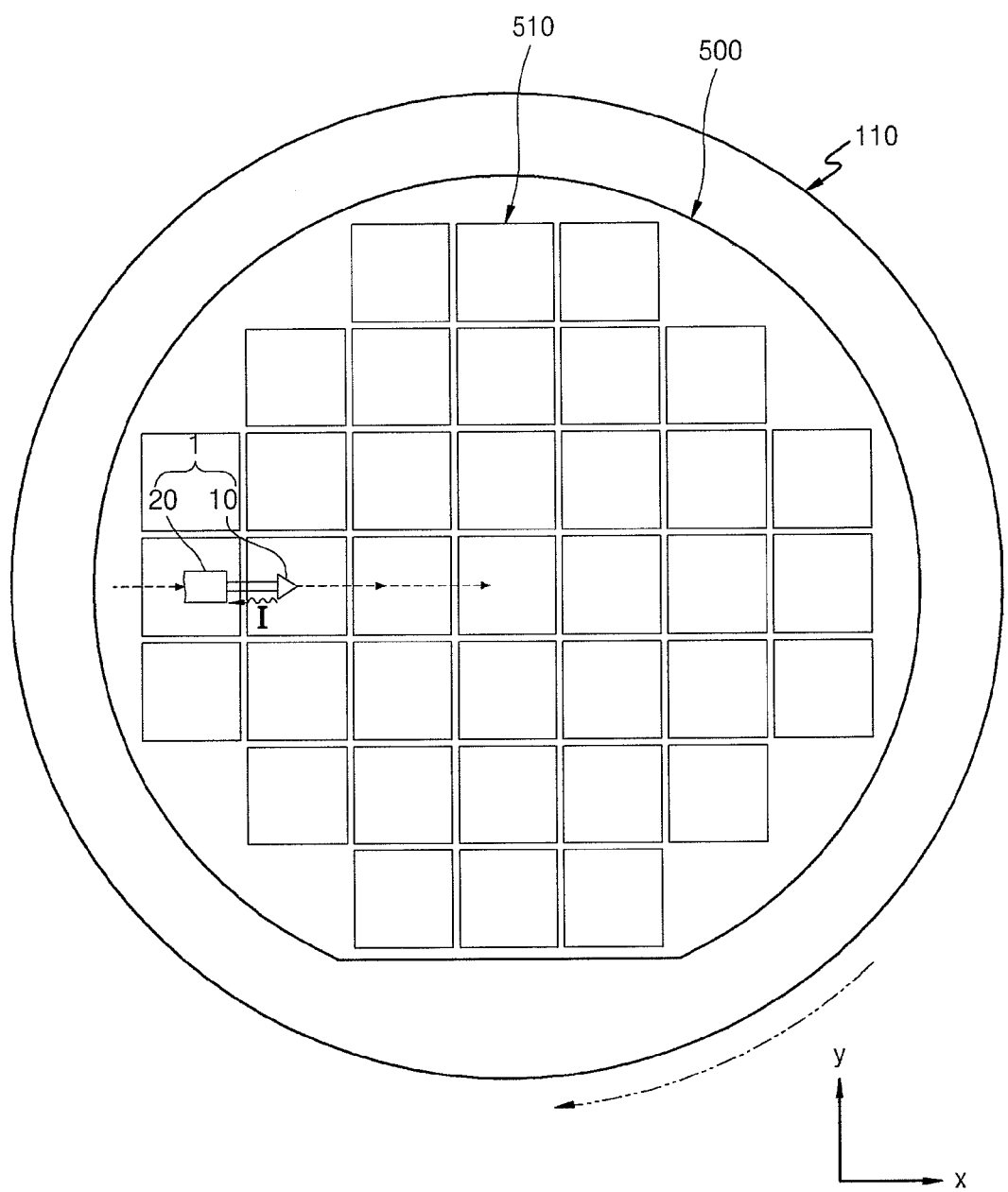
FIG. 6 illustrates a plan view illustrating a method for inspection of defects on a substrate according to an exemplary embodiment.

FIG. 6 is a plan view illustrating a method for inspection of defects on a substrate according to another embodiment of the present invention.

Referring to FIG. 6, the substrate 500 disposed on the stage 110 is rotated, and at the same time, the probe 10 of the defect inspection apparatus 1 may be moved from the outer portion to the center of the substrate 500. Also, although not shown in the drawing, when the substrate 500 rotates, the probe 10 of the defect inspection apparatus 1 may be moved from the center portion to the outer of the substrate 500 at the same time. The probe 10 may be moved on a line connecting the center and an outermost portion of the substrate 500. At this time, the center of the substrate 500 and the center of rotation of the substrate 500 may not correspond to each other. Here, the center of the substrate is intended to mean the center of rotation of the substrate 500. In addition, hereinafter, it will be described assuming that the center of the substrate 500 and the center of rotation of the substrate 500 correspond to each other.

Figure 7:
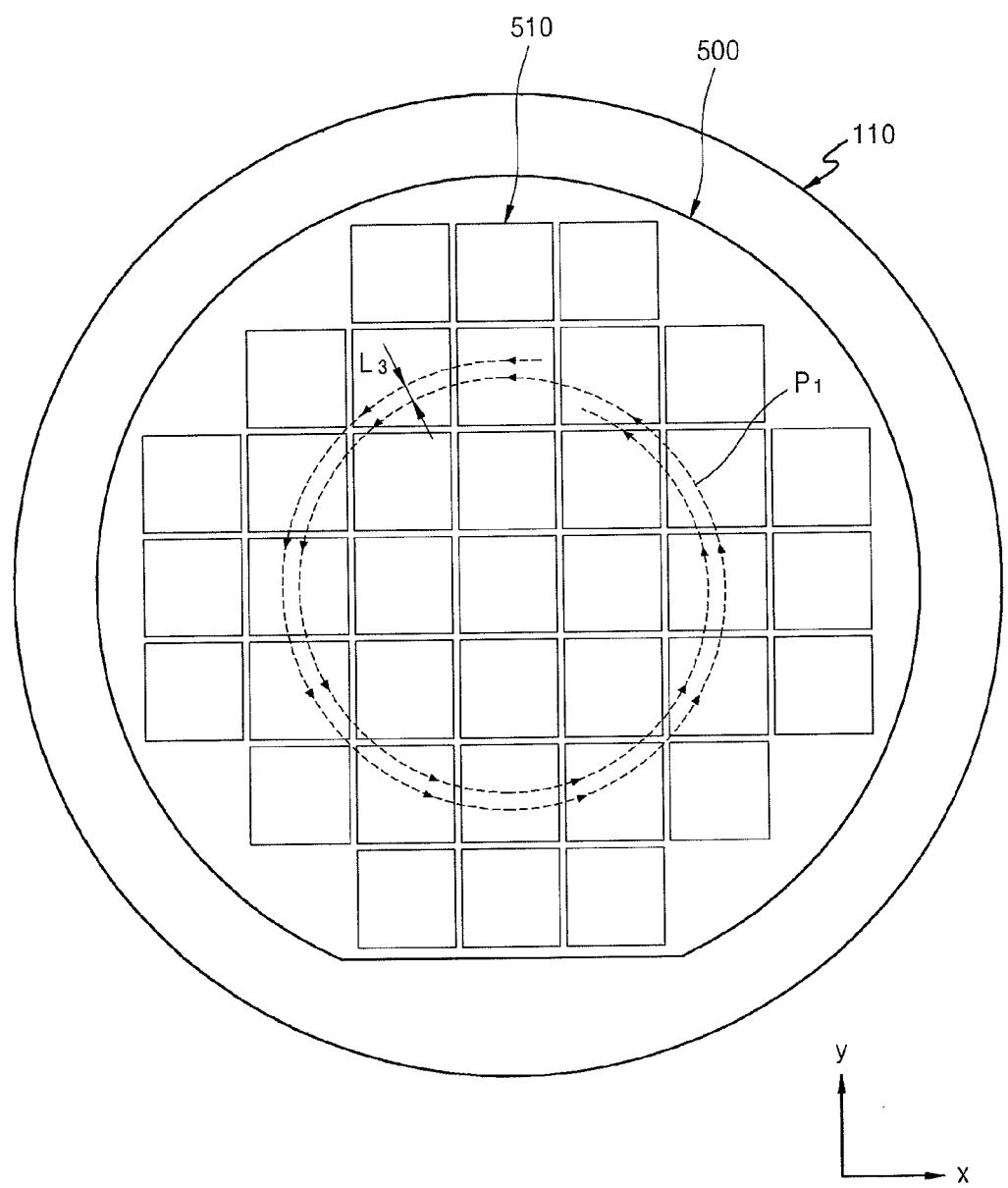
FIG. 7 illustrates a plan view of an aspect of a pathway of a probe in the method for inspection of defects on a substrate according to an exemplary embodiment.

FIG. 7 is a plan view of an aspect of a pathway of a probe in the method for inspection of defects on a substrate according to the embodiment of the present invention.

Referring to FIGS. 6 and 7, the probe 10 may be moved along a first pathway $P_1$ as shown over the substrate 500. The first pathway $P_1$ may spiral toward the center or outer portion of the substrate 500. That is, the probe 10 may be moved toward the center or outer portion of the substrate 500, in such a way that the first pathway P1 is moved by a third width $L_3$ with respect to the center of the substrate 500 whenever the substrate 500 rotates one revolution. In this case, the probe 10 may be moved toward the center or outer portion of the substrate 500 at a constant speed or in proportion to a rotation speed of the substrate 500. Thus, the probe 10 may perform scanning with respect to the substrate 500 while being spaced apart from the substrate 500 on a plane parallel to the main surface of the substrate 500.

Similarly to the first width $L_1$ corresponding to the resolution of the defect inspection apparatus 1 according to the previous embodiment of the present invention, the third width $L_3$ may be a resolution corresponding to one pixel when the defect inspection apparatus 1 according to the current embodiment scans the substrate 500.

In the current embodiment, a scanning speed of the substrate 500 may be determined by a rotation speed of the substrate 500 and the third width $L_3$. In particular, since the rotation speed of the substrate 500 may stably be up to several tens of thousands of R.P.M., the scanning speed of the substrate 500 according to the current embodiment described in FIGS. 5 through 7 may be greater than according to the embodiment described in FIGS. 2 and 3.

When the substrate 500 is a semiconductor substrate, major defect inspection regions of the substrate 500 to be inspected by the defect inspection apparatus 1 may be set to dies 510 formed in the substrate 500. For example, when the dies 510 formed on the outer side of the substrate 500 are selected as the defect inspection regions, portions where the dies 510 are not formed may still be scanned by the defect inspection apparatus 1, but may instead be excluded.

Figure 8:
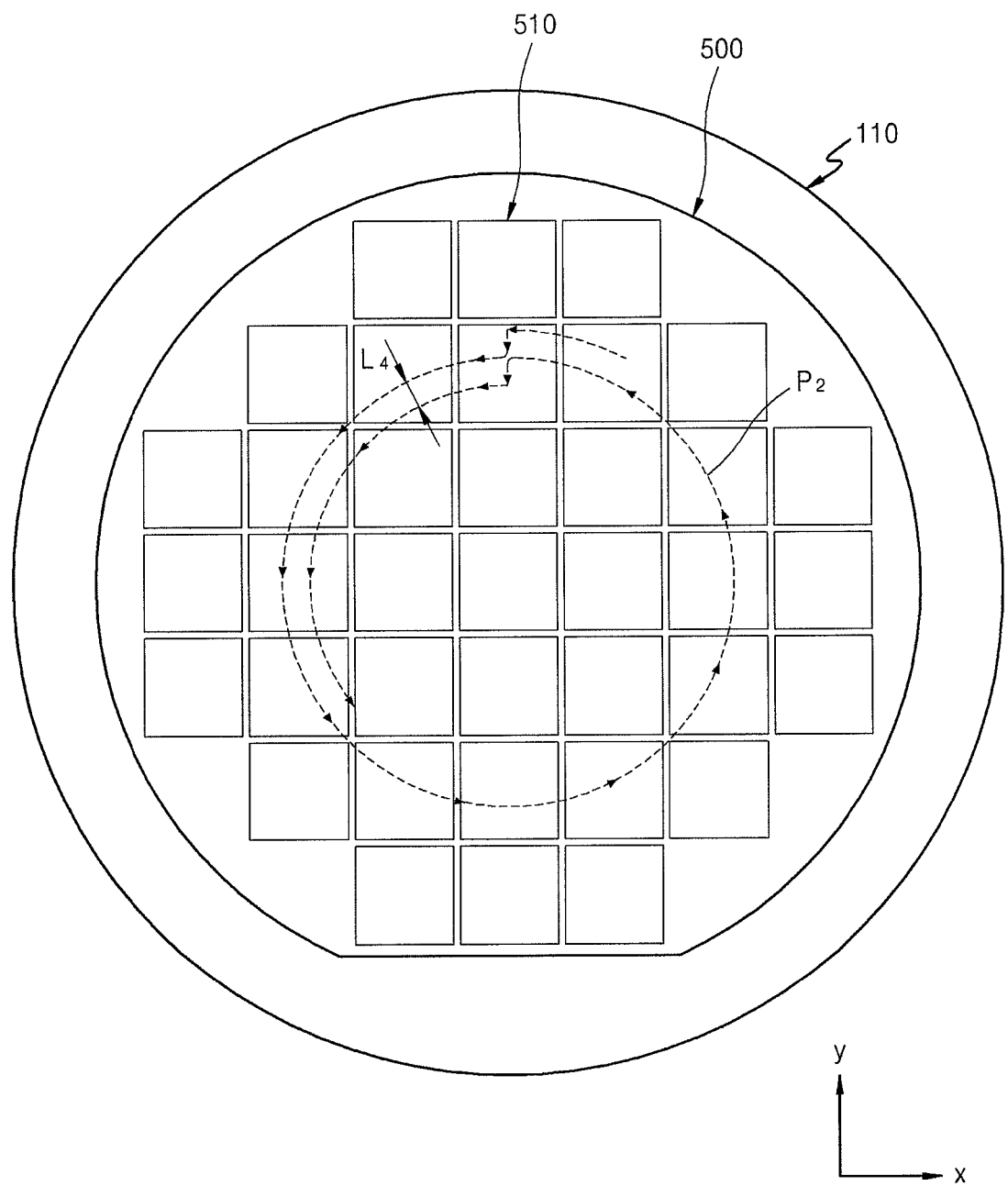
FIG. 8 illustrates a plan view of another aspect of a pathway of a probe in the method for inspection of defects on a substrate according to an exemplary embodiment.

FIG. 8 is a plan view of another aspect of a pathway of a probe in the method for inspection of defects on a substrate according to the current embodiment of the present invention.

Referring to FIGS. 7 and 8, a second pathway $P_2$ of the probe 10 is different from the first pathway $P_1$. The second pathway $P_2$ has a shape in which concentric circles having radiuses that are different by a fourth width $L_4$ are connected to adjacent concentric circles. That is, the probe 10 may scan along a circle on the substrate 500, shifted by the fourth width $L_4$ toward the center or toward an outer portion of the substrate 500, and then scan along a circle having a radius different by the fourth width $L_4$. In this case, the probe 10 may be step-shifted by the fourth width $L_4$ toward the center or an outer portion of the substrate 500 whenever the substrate 500 rotates one revolution. Thus, the probe 10 may scan the substrate 500 while being spaced apart from the substrate 500 on a plane parallel to the main surface of the substrate 500.

To increase accuracy of the defect inspection, after the substrate 500 is rotated more than one revolution, the probe 10 may be step-shifted. As such, when the probe 10 is step-shifted after the substrate 500 is rotated more than one revolution, a surplus induced current generated when the substrate 500 is rotated more than one revolution may be used to confirm the scanning position of the substrate 500.

For example, when the substrate 500 is a semiconductor substrate, defect inspection is to be performed in consideration of the positions of the dies 510 formed in the substrate 500 and of semiconductor circuits formed inside the dies 510. Accordingly, after an induced current is generated by the probe 10 scanning the substrate 500 along the second pathway $P_2$, the induced current is to be mapped to corresponding positions on the substrate 500. In this mapping process, the surplus induced current may be used to compensate for errors.

Similarly to the third width $L_3$, the fourth width $L_4$ may be a resolution corresponding to a width of one pixel when the defect inspection apparatus 1 according to the current embodiment scans the substrate 500.

Figure 9:
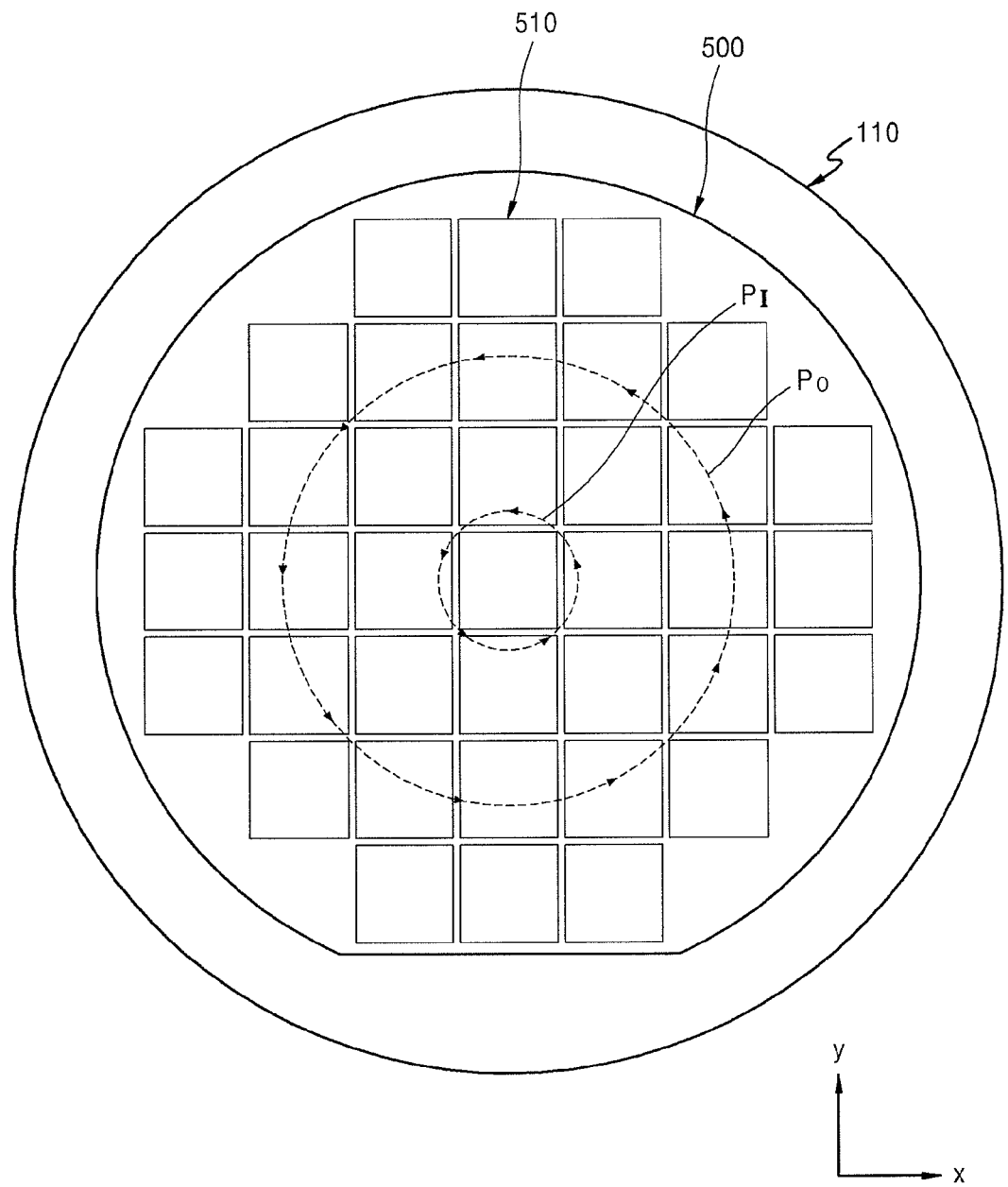
FIG. 9 illustrates a conceptual view for describing differences between pathways of a probe according to distance between the center of a substrate and the probe, according to an exemplary embodiment.

FIG. 9 is a conceptual view for describing differences between pathways of a probe according to distance between the center of a substrate and the probe, according to another embodiment of the present invention. FIG. 9 is a view for describing a concept that may be applied to either of the two aspects of the pathway of the probe 10 illustrated in FIGS. 7 and 8.

Referring to FIG. 9, when a inner pathway $P_I$, which is a pathway when the probe 10 is relatively close to the center of the substrate 500, and an outer pathway $P_O$, which is a pathway when the probe 10 is relatively far from the center of the substrate 500, are compared, the inner pathway $P_I$ is shorter than the outer pathway $P_O$. Accordingly, when the rotation speed of the substrate 500 is a constant speed, that is, a constant angular speed (CAV), a linear speed at which the probe 10 passes over a pathway of the probe 10 may vary. That is, the linear speed at which the probe 10 passes over the outer pathway $P_O$ is higher than that at which the probe 10 passes over the inner pathway $P_I$. Hereinafter, the constant speed rotation of the substrate 500 will be called a CAV rotation of the substrate 500. The induced current generated when the probe 10 passes through the outer pathway $P_O$ is more amplified than that generated when the probe 10 passes through the inner pathway $P_I$.

Accordingly, for the sake of comparison, the induced current generated may be compensated in consideration of linear speed at which the probe 10 passes over the pathway. For example, when the induced current generated when the probe 10 passes over the outer pathway $P_O$ is more amplified than that generated when the probe 10 passes over the inner pathway $P_I$, the induced current generated when the probe 10 passes over the inner pathway $P_I$ may be measured and amplified for compensation so that the compensated induced current may be compared with the induced current generated when the probe 10 passes over the outer pathway $P_O$.

Alternatively, the rotation speed of the substrate 500 may be controlled to maintain the linear speed at which the probe 10 passes over a pathway constant. That is, when the probe 10 passes over the inner pathway $P_I$ instead of the outer pathway $P_O$, the rotation speed of the substrate 500 may be increased to maintain the linear speed at which the probe 10 passes over a pathway, that is, to have a constant linear velocity (CLV). Hereinafter, the case where the linear speed at which the probe 10 passes over the pathway is constant by controlling the rotation speed of the substrate 500 is simply referred to as the case where the substrate 500 is rotated at a CLV. In this case, the induced current generated from the probe 10 may not be compensated with respect to the position of the probe 10.

The substrate 500 may be rotated by using a combination of a CAV rotation together with a CLV rotation described above. When the substrate 500 is rotated at a CLV, the rotation speed of the substrate 500 should be highly increased for portions closer to the center of the substrate 500. Accordingly, in this case, the substrate 500 may be rotated at a CAV in a region adjacent to the center, and rotated at a CLV in a region close to the outer portion of the substrate 500.

After the substrate 500 is divided into a plurality of regions based on distance from the center of the substrate 500, the substrate 500 may be rotated so that each region corresponds to a different CAV. That is, the region adjacent to the center of the substrate 500 may rotate at a relatively high CAV, and the region far from the center of the substrate 500 may rotate at a relatively low CAV.

Defect inspection may also be performed by combining any of the methods described in FIGS. 1 through 4 and any of the methods described with respect to FIGS. 5 through 9. For example, the center of the substrate 500 is scanned according to any of the methods described in FIGS. 1 through 4, and the other portions, that is, the outer portions of the substrate 500, are scanned according to any of the methods described in FIGS. 5 through 9, and then the results may be combined to be used for defect inspection.

FIGS. 10 through 16 are views illustrating methods of determining defects using a defect inspection apparatus. The methods of FIGS. 10 through 16 may be applied to cases where a probe scans a substrate by varying its relative position on a plane spaced apart from and parallel to the substrate, and thus may be applied to any of the above embodiments described in FIGS. 1 through 9.

Figure 10:
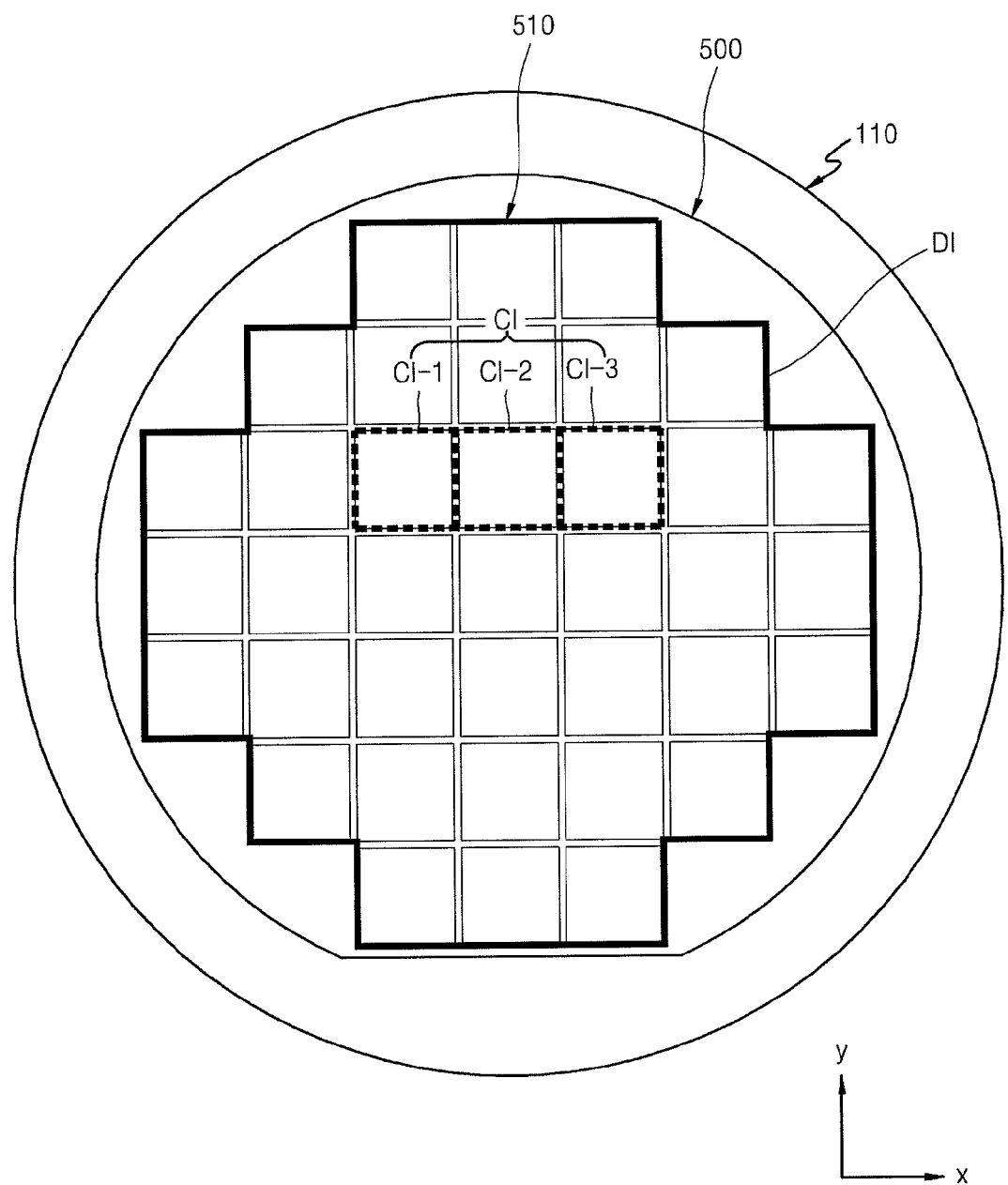
FIG. 10 illustrates a plan view illustrating a method of determining defects by comparing semiconductor dies, according to an exemplary embodiment.

FIG. 10 is a plan view illustrating a method of determining defects by comparing semiconductor dies, according to an embodiment of the present invention.

Referring to FIG. 10, a defect inspection region DI is designated on a substrate 500. For example, the substrate 500 may be a wafer-shaped semiconductor substrate. The defect inspection region DI may include dies 510 formed in the substrate 500. In the defect inspection region DI, different regions in which the same repeated pattern is formed may be defined as comparison inspection regions CI. The comparison inspection regions CI may each be one die 510 formed in the substrate 500 or a set of dies consisting of the same number of dies 510 in the substrate 500. More specifically, each of comparison inspection regions CI-1, CI-2, and CI-3 may be one die 510 or a plurality of dies 510.

Then, an induced current value is measured while the substrate 500 is scanned by any of the methods described in FIGS. 1 through 9. The measured induced current value may be mapped to the defect inspection region DI and/or the comparison inspection regions CI. That is, the defect inspection region DI and the measured induced current value may be corresponded to each other after the scanning method of the substrate 500.

Then, the induced current value measured in the first comparison inspection region CI-1 and the induced current value measured in the second comparison inspection region CI-2 are compared to detect defects from differences therebetween. Alternatively, the induced current values measured in the first through third comparison inspection regions CI-1 through CI-3 or in four or more comparison inspection regions are compared with one another to detect defects from differences among them. Such defect inspection method may be called a die-to-die (DTD) method hereinafter. The DTD method may be used to detect defects of a non-memory device or defects of peripheral circuit region of a memory device.

The plurality of comparison inspection regions CI selected to detect defects may be arbitrarily different comparison inspection regions CI. However, when the substrate 500 is wide, deviations are accumulated in parts spaced apart from one another in the substrate 500 over many manufacturing processes, thereby resulting in a significant amount of noise, and thus adjacent comparison inspection regions CI may be selected.

Figure 11:
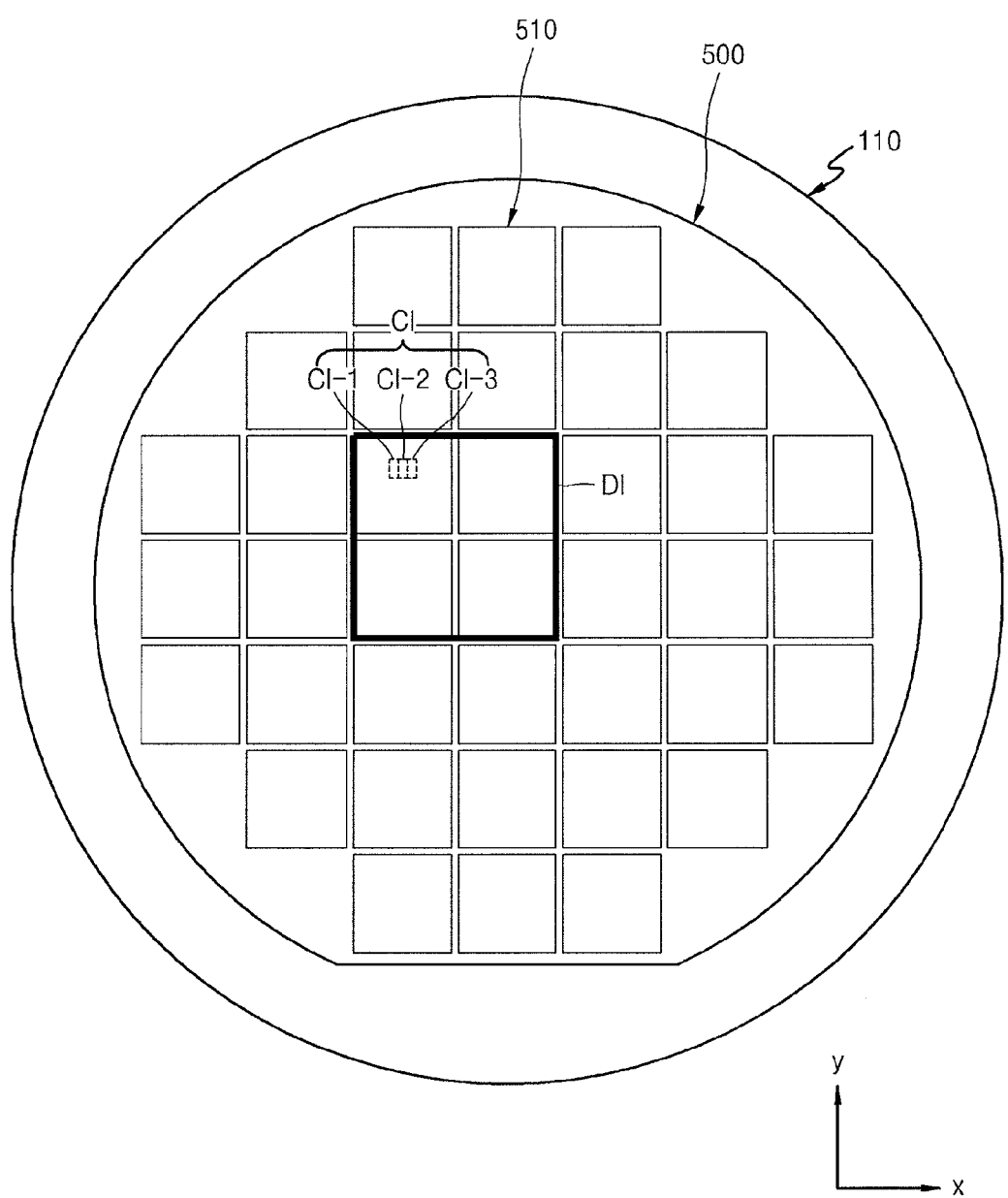
FIG. 11 illustrates a plan view illustrating a method of determining defects by comparing semiconductor cells, according to an exemplary embodiment.

FIG. 11 is a plan view illustrating a method of determining defects by comparing semiconductor cells, according to an embodiment of the present invention.

Referring to FIG. 11, a defect inspection region DI is designated on a substrate 500. For example, the substrate 500 may be a wafer-shaped semiconductor substrate. The substrate 500 may also include a semiconductor device including a memory cell. The defect inspection region DI may include one die 510 or a part of the one die 510. The defect inspection region DI may instead include a plurality of dies 510 or parts of the plurality of dies 510.

In the defect inspection region DI, different regions in which the same repeated pattern is formed may be defined as comparison inspection regions CI. When the substrate 500 is a semiconductor device or a memory device including memory cells, space where the memory cells are disposed may be called a cell region. The cell regions include unit regions. The unit regions has a rectangular shape with a length and a width of several tens to several hundreds of nm and may be repeatedly arranged in an array. Also, sense amplifiers or decoders may be repeatedly arranged adjacent to the cell region in an x-axis direction or a y-axis direction, and hereinafter, these regions may be called repeated pattern formation regions.

Accordingly, the defect inspection region DI may include the cell region or the repeated pattern formation region adjacent to the cell region. The cell region or the repeated pattern formation region may be divided into the comparison inspection regions CI repeated. At this time, one comparison inspection region CI may be a minimum repeated region or include a plurality of minimum repeated regions.

Then, the induced current values respectively measured in the first comparison inspection region CI-1 and the second comparison inspection region CI-2 may be compared with each other, and defects may be detected from differences therebetween. The induced current values measured in the first through third comparison inspection regions CI-1, CI-2, and CI-3 or in four or more comparison inspection regions may be compared with one another to detect defects from differences among them. Such defect inspection method may be called a cell-to-cell (CTC) method hereinafter. The CTC method may be used to inspect defects in a semiconductor device including a memory device or a memory cell.

The plurality of comparison inspection regions CI selected to detect defects may be arbitrarily different comparison inspection regions CI arbitrarily chosen. However, when the substrate 500 is wide, deviations are accumulated in parts spaced far apart from one another in the substrate 500 over many manufacturing processes, thereby resulting in a significant amount of noise, and thus adjacent comparison inspection regions CI may be selected.

Figure 12:
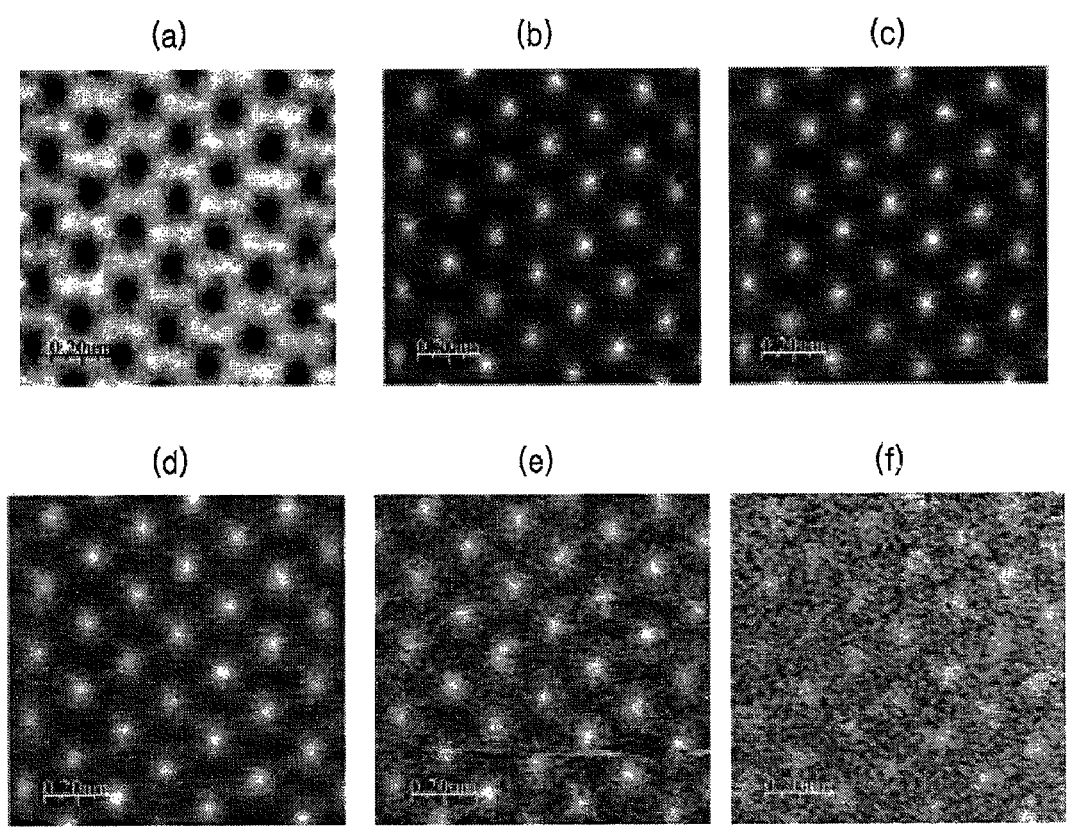
FIG. 12 illustrates images formed from induced currents measured by scanning a substrate according to different distances between a probe and the substrate, according to an exemplary embodiment.

FIG. 12 illustrates images of formed from induced currents measured by scanning a substrate according to different distances between a probe and the substrate, according to an embodiment of the present invention. In FIG. 12, the distance between the probe and the substrate is the first interval H described in FIG. 2 or FIG. 5, which will be called the first interval H below.

Referring to FIGS. 2, 5 and 12, an image (a) of FIG. 12 is a topology image obtained via SPM in a contact manner. Images (b) through (f) of FIG. 12 illustrate the images formed from the induced currents measured by setting the first interval H to 10 nm, 50 nm, 100 nm, 200 nm, and 400 nm, respectively. The image (a) of FIG. 12 illustrates a real shape of a substrate. However, the images (b) through (f) of FIG. 12 do not illustrate real shapes of a substrate, but illustrate that differences according to shape and material of the substrate 500 may be distinguished. Accordingly, the first interval H, that is, the distance between the substrate 500 and the probe 10 may be in the range of about 10 nm to about 400 nm in length.

Theoretically, the first interval H may be less than 10 nm in length. However, in consideration of a surface step of the substrate 500, the first interval H may have a relatively great value. Also, since the differences according to the shape and material of the substrate 500 may be required distinguished precisely, the first interval H may not have too great a value. When these are considered, the first interval H may be in the range of about 100 nm to about 200 nm in length.

Figure 13:
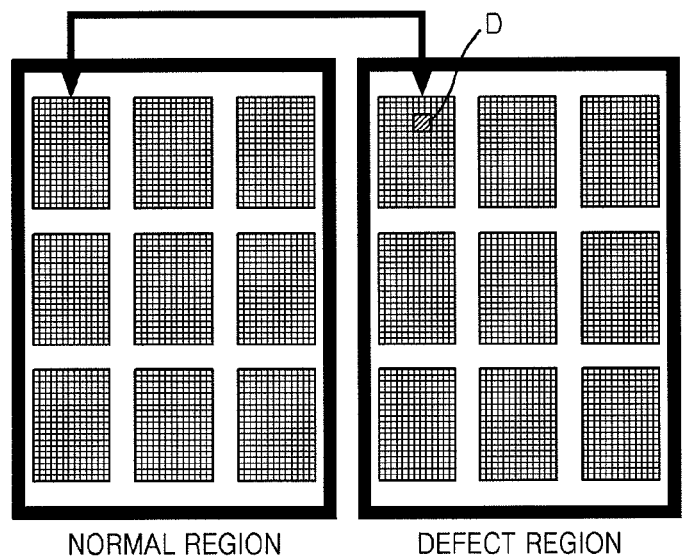
FIG. 13 illustrates a conceptual view illustrating an aspect of a defect determination method, according to an exemplary embodiment.

FIG. 13 is a conceptual view illustrating an aspect of a defect determination method, according to an embodiment of the present invention.

Referring to FIGS. 10, 11, and 13, comparison inspection regions CI may include both a normal region not having a defect and a defect region having a defect D. When the two regions, that is, the normal region and the defect region, are compared with each other, differences may be detected at a position corresponding to the defect D, and thus the defect D may be determined.

As such, when the defect D is determined between the two comparison inspection regions CI, the normal region may be first determined. For example, one comparison inspection region CI is first determined as the normal region, and then compared with the other comparison inspection region CI, and determine whether the other comparison inspection region CI is a defect region or not.

Figure 14:
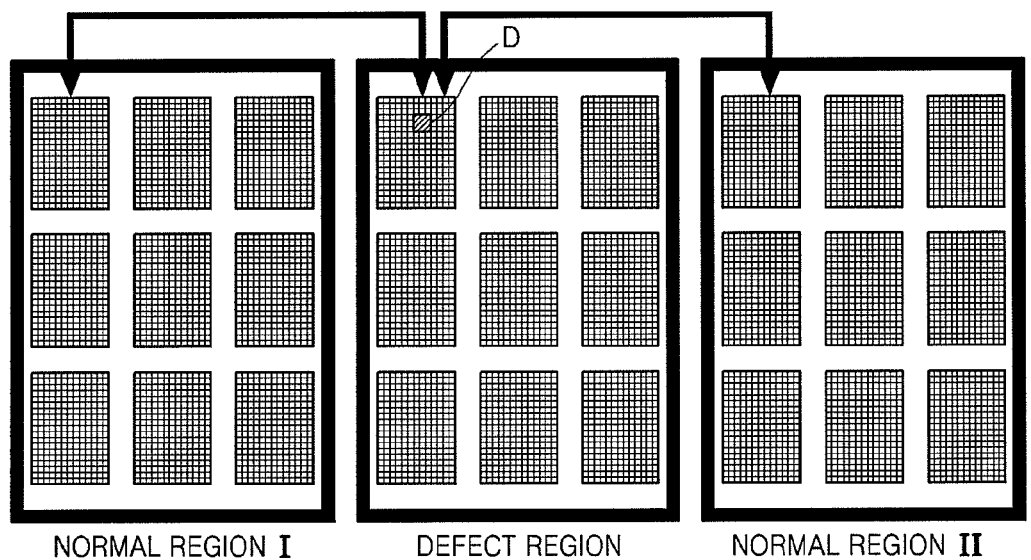
FIG. 14 illustrates a conceptual view of another aspect of a defect determination method, according to an exemplary embodiment.

FIG. 14 is a conceptual view of another aspect of a defect determination method, according to an embodiment of the present invention.

Referring to FIGS. 10, 11, and 14, the comparison inspection regions CI may include normal regions not having a defect (normal regions I and II) and a defect region having a defect D. When three or more comparison inspection regions CI, that is, the normal regions and the defect region are compared with one another, differences may be detected corresponding to the defect D, and thus the defect D may be determined.

For example, the defect region is compared with the two normal regions (the normal regions I and II) to obtain two comparison results. When the comparison results have the same difference, the defect D may be determined. This will be described later, but the same difference may instead mean that the difference is greater than a predetermined threshold value in the same position. On the contrary, when the defect region is the same as both the normal regions or different from only one of the normal regions, it may be determined that there is no defect D.

Figure 15:
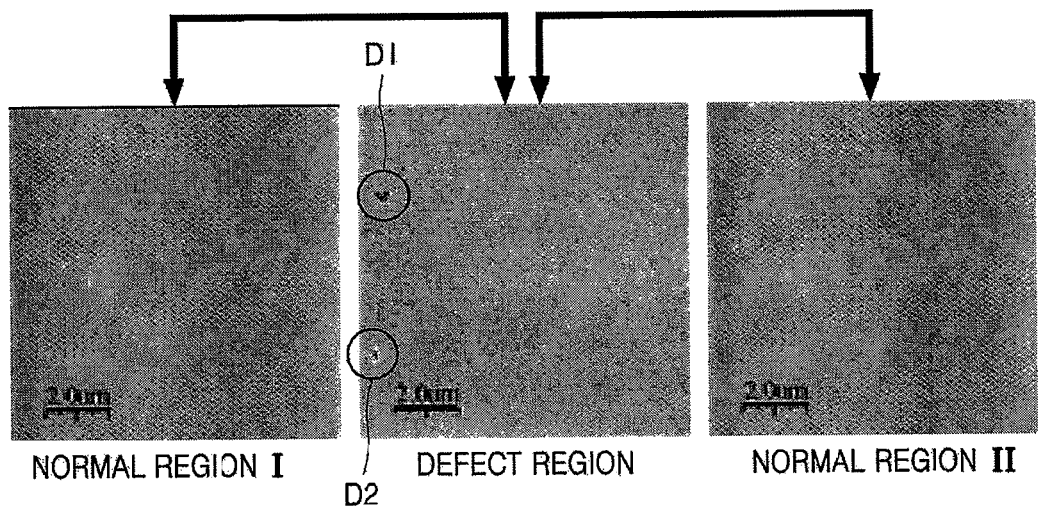
FIG. 15 illustrates scanning probe microscopy (SPM) images illustrating a defect determination method, according to an exemplary embodiment.

FIG. 15 shows scanning probe microscopy (SPM) images illustrating a defect determination method, according to an embodiment of the present invention.

Referring to FIGS. 14 and 15, when the defect region and the two normal regions (normal regions I and II) are compared with each other, first and second defects D1 and D2 are not present in the two normal regions. That is, the defect region is different from the two normal regions, thus the defects D1 and D2 may be determined.

Figure 16:
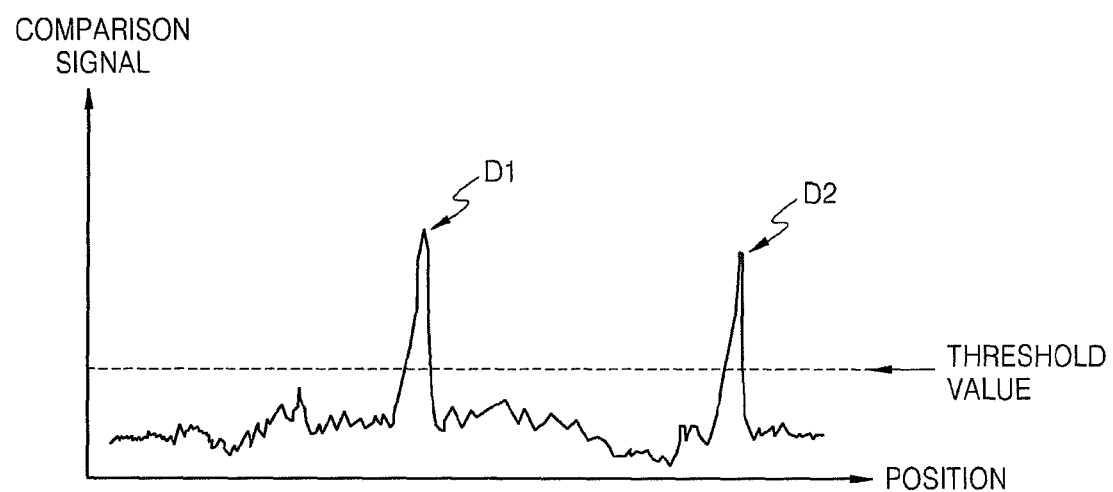
FIG. 16 illustrates a graph illustrating a method for assigning a threshold value for defect determination, according to an exemplary embodiment.

FIG. 16 is a graph illustrating a method for assigning a threshold value for defect determination, according to an embodiment of the present invention.

Referring to FIG. 16, as a result of measurement in two comparison inspection regions, a comparison result including comparison signals that are generated from a comparison of induced currents or compensated induced currents may be obtained. From among the comparison signals, a proper threshold value is set and portions of comparison signals having a value greater than a threshold value may be identified as defects, such as defects D1 and D2. If when the result measured in the three comparison regions is compared as like the defect determination method described in FIG. 14, it may be determined as a defect when the comparison signal exceeding the threshold value accords with the two comparison results.

The threshold value may be established in consideration of noise during the measurement and compensation, and deviations according to a measured position. For example, regions that are relatively close to one another on a substrate may have less deviation compared to regions that are relatively far from one another, because the variation depending on the positions on the substrate may occur during the semiconductor manufacturing process.

The threshold value may use the same value when defect inspection is performed with respect to one substrate, but may use different values by dividing regions on the one substrate.

Figure 17:
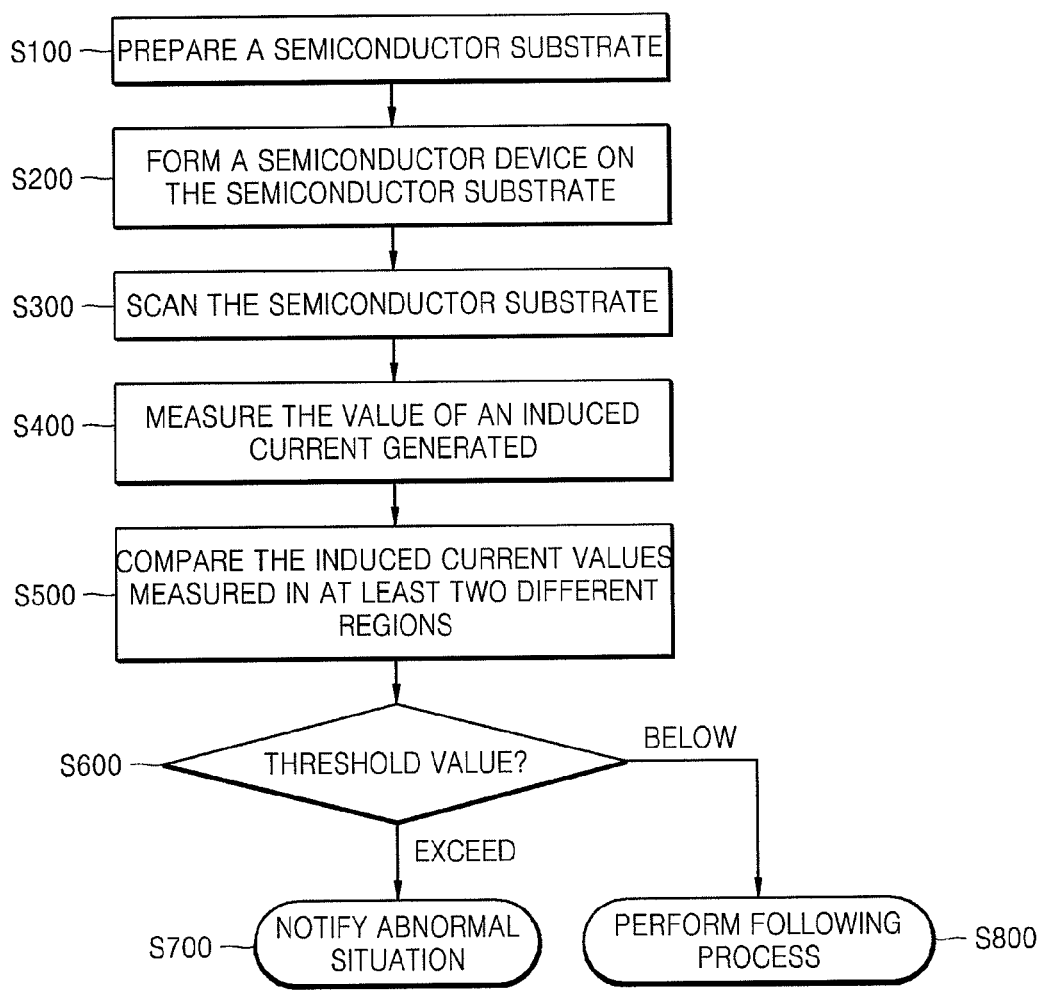
FIG. 17 illustrates a flowchart showing a method of manufacturing a semiconductor device including a method for inspection of defects on a substrate, according to an exemplary embodiment.

FIG. 17 is a flowchart illustrating a method of manufacturing a semiconductor device including a method for inspection of defects on a substrate, according to an embodiment of the present invention. Details described in FIGS. 1 through 16 will be omitted below.

Referring to FIG. 17, a semiconductor substrate for inspecting defects is prepared (S100). The semiconductor substrate may be a wafer-shaped substrate. Then, a semiconductor device is formed on the semiconductor substrate (S200).

The semiconductor device may be formed by a fabrication process including forming a thin film on the semiconductor substrate. The thin film may be formed of a conductive material, an insulating material, or a semiconductor material. The fabrication process may further include a process for forming a mask pattern on the thin film. The mask pattern may be a photoresist pattern. The fabrication process may further include a process for forming a pattern by removing the thin film partially by using the mask pattern as an etching mask. In addition, the fabrication process may further include a process for forming a hole by removing the thin film partially by using the mask pattern as an etching mask. The hole may include a contact hole, a via hole, or the like.

The fabrication process may further include a process for cleaning the thin film. In addition, the fabrication process may further include a process for planarizing the thin film. The planarization process of the thin film may include a chemical mechanical polishing (CMP) process or an etch-back process. Although not described above, the fabrication process may include any of various other processes that may be performed in the manufacturing process of the semiconductor device. Accordingly, the fabrication process may include processes for transferring and storing the semiconductor substrate.

After any one of the aforementioned fabrication processes is performed, a probe may scan the semiconductor substrate via SPM according to any of the defect inspection methods described in FIGS. 1 through 9 (S300) and measure an induced current value generated by scanning the semiconductor substrate (S400). Then, the induced current values measured in at least two different regions of the semiconductor substrate are compared (S500). At this point, not only the measured induced current value is compared without change, but also a result obtained by compensating the induced current value may be compared.

Then, defects are determined according to whether the comparison result of the measured induced current value exceeds a threshold value (S600). When the comparison result exceeds the threshold value, an abnormal situation may be notified (S700). The notification of the abnormal situation may be a notification of a defect. When the comparison result does not exceed a threshold value, it may be determined there is no defect, and following manufacturing process may be performed (S800).

That is, according to the semiconductor manufacturing process, defects of the semiconductor substrate may be inspected using the aforementioned substrate defect inspection apparatus and method during the semiconductor manufacturing process.

While the inventive concept has been particularly shown and described with reference to exemplary embodiments thereof, it will be understood that various changes in form and details may be made therein without departing from the spirit and scope of the following claims.

What is claimed is:

1. A method for inspection of defects on a substrate, the method comprising:
   positioning a probe of a scanning probe microscopy (SPM) over and spaced apart from a substrate;
   scanning the substrate by changing a relative position of the probe with respect to the substrate on a plane spaced apart from and parallel to the substrate, the scanning of the substrate including:
      vibrating the probe in a direction parallel to the substrate along a first straight line on the plane spaced apart from and parallel to the substrate, and
      moving the probe with respect to the substrate by moving a center of the vibration of the probe along a second straight line on the plane spaced apart from and parallel to the substrate, the second straight line being perpendicular to the first straight line;
   measuring a value of an induced current generated via the probe in at least two different regions of the substrate, the value of the induced current being variable according to at least a shape and a material of the substrate; and
   determining whether a defect exists by comparing the values of the induced currents measured in the at least two different regions of the substrate.

2. The method as claimed in claim 1, wherein:
   vibrating of the probe includes vibrating the probe with a constant amplitude along the first straight line on the plane spaced apart from and parallel to the substrate; and
   the moving of the probe includes moving the probe in a zigzag manner with respect to the substrate by moving the center of the vibration of the probe at a constant speed along the second straight line on the plane spaced apart from and parallel to the substrate.

3. The method as claimed in claim 2, wherein the scanning of the substrate further includes moving the center of the vibration of the probe at a constant speed along a third straight line spaced apart from the second straight line and parallel to the second straight line, the second straight line and the third straight line being spaced apart from each other at a distance the same as or less than the amplitude of the vibration the probe.

4. The method as claimed in claim 1, further comprising:
designating a defect inspection region on the substrate before the positioning of the probe; and
dividing the defect inspection region into a plurality of comparison inspection regions, a pattern formed in each comparison inspection region being the same.

5. The method as claimed in claim 4, wherein the dividing of the defect inspection region into the plurality of comparison inspection regions includes dividing the defect inspection region into a plurality of dies formed in the substrate.

6. The method as claimed in claim 4, wherein the defect inspection region on the substrate includes a cell region of the substrate or a repeated pattern formation region adjacent to a cell region.

7. The method as claimed in claim 4, wherein the determining of whether the defect exists includes comparing the values of the induced currents measured in three different comparison inspection regions.

8. The method as claimed in claim 7, wherein the comparing of the values of the induced currents includes:
selecting one of the three different comparison inspection regions as a standard inspecting region; and
comparing the value of the induced current measured in the standard inspecting region with each of the values of the induced currents measured in the two other comparison inspection regions to obtain two comparison results,
wherein, when the two comparison results are greater than a predetermined threshold value, the standard inspection region is determined to include the defect.

9. The method as claimed in claim 1, wherein a distance between the substrate and the probe is in the range of about 10 nm to about 400 nm.

10. The method as claimed in claim 1, wherein the determining of whether the defect exists includes comparing the values of the induced currents measured in the at least two different regions and determining that the defect exists when a comparison result of the values of the induced currents is greater than a predetermined threshold value.

11. The method as claimed in claim 1, wherein the probe is a plurality of probes that are spaced apart from the substrate at a same distance.

12. The method as claimed in claim 1, wherein the scanning of the substrate by changing the relative position of the probe with respect to the substrate includes vibrating and moving the probe only above the plane spaced apart from and parallel to the substrate.

13. A method for inspection of defects on a substrate, the method comprising:
positioning a probe of a scanning probe microscopy (SPM) on a substrate spaced apart from the substrate;
scanning the substrate by changing a relative position of the probe on a plane spaced apart from and parallel to the substrate, the scanning of the substrate including moving the probe with respect to the substrate while rotating the substrate such that the probe is moved only in a first direction from an outer portion to a center of the substrate or only in a second direction from the center to the outer portion of the substrate while rotating the substrate;
measuring a value of an induced current generated via the probe in at least two different regions of the substrate, the value of the induced current being variable according to at least a shape and a material of the substrate; and
determining whether a defect exists by comparing the values of the induced currents measured in the at least two different regions of the substrate.

14. The method as claimed in claim 13, wherein the scanning of the substrate further includes controlling a rotation speed of the substrate such that the probe has a constant linear velocity (CLV) with respect to a pathway of the probe on the substrate.

15. The method as claimed in claim 13, wherein the scanning of the substrate includes rotating the substrate at a constant angular velocity.

16. The method as claimed in claim 15, further comprising, after the measuring of the value of the induced current, compensating the measured value of the induced current according to a speed of the probe with respect to a pathway of the probe on the substrate.

17. The method as claimed in claim 13, wherein the scanning of the substrate by changing a relative position of the probe includes moving the probe only above the plane spaced apart from and parallel to the substrate.

18. A method of manufacturing a semiconductor device, the method comprising:
preparing a semiconductor substrate; and
forming a semiconductor device on the semiconductor substrate,
wherein the forming the semiconductor device includes:
forming a thin film on the semiconductor substrate;
scanning the semiconductor substrate with a probe of a scanning probe microscopy (SPM) by changing a relative position of the probe with respect to the substrate on a plane spaced apart from and parallel to the substrate such that the probe is spaced apart from an uppermost surface of the semiconductor substrate by a fixed interval during the scanning of the semiconductor substrate with the probe, the scanning of the substrate including:
vibrating the probe in a direction parallel to the substrate along a first straight line on the plane spaced apart from and parallel to the substrate, and
moving the probe with respect to the substrate by moving a center of the vibration of the probe along a second straight line on the plane spaced apart from and parallel to the substrate, the second straight line being perpendicular to the first straight line;
measuring a value of an induced current generated via the probe in at least two different regions on the semiconductor substrate, the value of the induced current being variable according to at least a shape and a material of the substrate; and
determining whether a defect exists by comparing the values of the induced currents measured in at the least two different regions of the semiconductor substrate.

19. The method as claimed in claim 18, further comprising, after the forming of the thin film, forming a pattern by partially removing the thin film.

20. The method as claimed in claim 19, wherein the forming of the pattern includes forming a contact hole by removing the thin film partially.

* * * * *